US012304190B2

(12) United States Patent
 Arlt

(10) Patent No.: US 12,304,190 B2
(45) Date of Patent: May 20, 2025

(54) UV LED RADIATION SOURCES FOR USE IN PHOTOPOLYMER EXPOSURE

(71) Applicant: Esko-Graphics Imaging GmbH, Itzehoe (DE)

(72) Inventor: Klaus Walter Arlt, Itzehoe (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 661 days.

(21) Appl. No.: 16/972,312

(22) PCT Filed: Aug. 28, 2020

(86) PCT No.: PCT/EP2020/074075
§ 371 (c)(1),
(2) Date: Dec. 4, 2020

(87) PCT Pub. No.: WO2021/038039
PCT Pub. Date: Mar. 4, 2021

(65) Prior Publication Data
US 2022/0305769 A1    Sep. 29, 2022

Related U.S. Application Data

(60) Provisional application No. 62/893,395, filed on Aug. 29, 2019.

(51) Int. Cl.
*B41C 1/10*    (2006.01)
*G03F 7/20*    (2006.01)

(52) U.S. Cl.
CPC .......... *B41C 1/1025* (2013.01); *G03F 7/2004* (2013.01); *G03F 7/201* (2013.01); *B41C 2201/14* (2013.01)

(58) Field of Classification Search
CPC . B41C 1/1025; B41C 2201/14; G03F 7/2004; G03F 7/201; G03F 7/7005;
(Continued)

(56) References Cited

U.S. PATENT DOCUMENTS 4,103,155 A     7/1978   Clark
6,969,954 B2 †  11/2005  Lys
(Continued)

FOREIGN PATENT DOCUMENTS

CN    102736409 A    10/2012
CN    108644628 A    10/2018
(Continued)

OTHER PUBLICATIONS

Japanese Notice of Reasons for Refusal for Japanese Application No. 2021-500255, dated Jan. 17, 2022, with translation, 8 pages.
(Continued)

*Primary Examiner* — Elmito Breval
(74) *Attorney, Agent, or Firm* — Buchanan Ingersoll & Rooney PC

(57) ABSTRACT

A source of actinic radiation for curing printing plates. The source includes a base with a heat sink and has a length greater than its width. One or more circuit boards mounted on the base provide a plurality of light emitting diodes (LEDs) distributed over the length of the base. A transparent or translucent cover together with the base defines an enclosure for the plurality of LEDs. The source provides the radiation at an emission angle greater than the emission angles of a single LED in a plane perpendicular to the axis of the base, in a plane containing the axis of the base or parallel to the axis of the base and perpendicular to the target illumination plane, or a combination thereof. The source may be configured to replace a fluorescent bulb. Methods and systems for bank exposure of printing plates using such sources are also described.

37 Claims, 7 Drawing Sheets

(58) Field of Classification Search
CPC ......... G03F 7/2055; G03F 7/24; G02B 3/08; G02B 19/0014; G02B 19/0066; F21K 9/278; H05B 45/10; F21W 2131/40; F21Y 2103/10; F21Y 2115/10
See application file for complete search history.

(56) References Cited

U.S. PATENT DOCUMENTS

| | | | |
|---|---|---|---|
| 7,307,391 B2 † | 12/2007 | Shan | |
| 7,507,001 B2 † | 3/2009 | Kit | |
| 8,093,823 B1 | 1/2012 | Ivey et al. | |
| 8,188,946 B2 † | 5/2012 | Nathan | |
| 8,578,854 B2 | 11/2013 | Sievers | |
| 8,699,921 B2 | 4/2014 | Petermann | |
| 8,772,740 B2 | 7/2014 | Klein et al. | |
| 8,803,773 B2 | 8/2014 | Ozawa | |
| 8,913,044 B2 | 12/2014 | Miyazawa | |
| 9,192,030 B2 † | 11/2015 | Tran | |
| 9,464,793 B2 † | 10/2016 | May | |
| 9,529,263 B2 | 12/2016 | Struewe et al. | |
| 10,024,518 B2 | 7/2018 | Childers | |
| 10,036,956 B2 | 7/2018 | Baldwin et al. | |
| 10,514,156 B2 † | 12/2019 | Ando | |
| 10,876,690 B2 † | 12/2020 | Xu | |
| 2009/0148620 A1* | 6/2009 | Petermann | B41F 23/0409 427/511 |
| 2009/0244510 A1 | 10/2009 | Domanowski | |
| 2009/0290891 A1 | 11/2009 | Sievers | |
| 2009/0294696 A1 | 12/2009 | Sievers | |
| 2010/0013637 A1 | 1/2010 | Trosper et al. | |
| 2010/0154244 A1 | 6/2010 | Kuta et al. | |
| 2011/0198509 A1 | 8/2011 | Gostein et al. | |
| 2012/0033420 A1 | 2/2012 | Kim et al. | |
| 2012/0043909 A1 | 2/2012 | Bloom et al. | |
| 2012/0212953 A1 | 8/2012 | Bloom et al. | |
| 2013/0044475 A1 † | 2/2013 | Hutchens | |
| 2013/0271970 A1* | 10/2013 | Childers | G02B 19/0066 362/218 |
| 2014/0057207 A1 † | 2/2014 | Baldwin | |
| 2016/0305617 A1 | 10/2016 | Lin et al. | |
| 2016/0313491 A1 | 10/2016 | Li et al. | |
| 2017/0343281 A1 | 11/2017 | Kuta et al. | |
| 2018/0004093 A1 | 1/2018 | Fronczkiewicz et al. | |
| 2018/0210345 A1 † | 7/2018 | Wolterink et al. | |
| 2019/0107258 A1 | 4/2019 | Lo | |
| 2019/0338897 A1 | 11/2019 | Brown et al. | |
| 2019/0376650 A1 | 12/2019 | Pang et al. | |
| 2021/0080065 A1 | 3/2021 | Brown et al. | |
| 2021/0332945 A1 | 10/2021 | Jones et al. | |
| 2022/0057051 A1 | 2/2022 | Brown et al. | |
| 2023/0033333 A1 | 2/2023 | Brown et al. | |
| 2023/0258306 A1 | 8/2023 | Smith et al. | |
| 2024/0212531 A1 | 6/2024 | Smith | |

FOREIGN PATENT DOCUMENTS

| | | |
|---|---|---|
| EP | 2110709 A1 | 10/2009 |
| EP | 2128702 A1 | 12/2009 |
| EP | 2128702 B1 † | 1/2017 |
| JP | 2003215809 A | 7/2003 |
| JP | 2008523451 A | 7/2008 |
| JP | 2009137302 A | 6/2009 |
| JP | 2010192347 A | 9/2010 |
| JP | 2011108424 A | 6/2011 |
| JP | 2011159391 A | 8/2011 |
| JP | 2012038532 A † | 2/2012 |
| JP | 2012079610 A † | 4/2012 |
| JP | 5519926 B2 | 6/2014 |
| JP | 3197099 U | 4/2015 |
| JP | 2016085896 A | 5/2016 |
| JP | 2016524172 A | 8/2016 |
| JP | 2018503120 A | 2/2018 |
| JP | 2019020474 A | 2/2019 |
| KR | 100970856 A1 † | 7/2010 |
| KR | 100970856 B1 † | 7/2010 |
| KR | 20110024440 A † | 3/2011 |
| KR | 20110043377 A † | 4/2011 |
| KR | 101074016 B1 † | 10/2011 |
| KR | 101156555 B1 † | 6/2012 |
| KR | 20190032902 A † | 3/2019 |
| TW | 201706646 A | 2/2017 |
| WO | 2008135865 A2 | 11/2008 |
| WO | 2015100766 A1 † | 7/2015 |
| WO | 2017072588 A2 | 5/2017 |
| WO | 2017192499 A1 | 11/2017 |
| WO | 2020216948 A1 | 10/2020 |

OTHER PUBLICATIONS

DuPont Cyrel 1000 ECDLF, State-of-the-Art Exposure, Dryer & Light Finisher, 2013, 2 pages.
DuPont Cyrel Fast Easy EFX, Built in Flat Top Dot, High Ink Transfer Digital Plate, 2015, 2 pages.
Philips Lighting, Flexo Print, TL 80W/10-R SLV/25, Feb. 2, 2019, 2 pages.
U.S. Appl. No. 62/839,171, filed Apr. 26, 2019, 33 pages.
Korean Notification of Grounds for Refusal for Korean Application No. 1-2023-7000213, dated May 23, 2023 with translation, 20 pages.
D11—Wildfire Sable LED LED Lamps, High Output Black Light LED Tube Lamps, 2016, 2 pages.
D 12—Sable LED Black Light LED Lamps Installation Manual, 2017, 11 pages.
D13—Introducing Sableled—Finally, a Viable Inexpensive UV-LED Upgrade Path For UV Fluorescents, 2016, 2 pages.
D14—Asmetec GmbH, LED UV Licht zur Hartung und Polymerisation von UV-Sensiblen Produkten, Metolight Led Tube-UV-365, 2019, 4 pages.
D15—Asmetec Konformitatserklarung (Declaration of Conformity), 2019, 1 page.
D16—ITL UV Integration, Solidcure 2 Addressable Range, Operating & Maintenance Manual, 2016, 28 pages.
D19—Pro Photonix, Intensity Control in UV LED Curing Systems, 2019, 8 pages.
D 20—Letter from John Berardi, President/CEO Wildfire Lighting, 1 page.
European Communication of Notice of Opposition of European Application No. 20764634.0, European Patent No. 3811155 dated May 3, 2023, 29 pages.
Opposition Brief for Opposition to European Patent No. 3811155, dated Apr. 26, 2023, 21 pages.
Extended European Search Report for European Application No. 22186755.9, dated Nov. 8, 2022, 9 pages.
Chinese Office Action with Search Report for Chinese Application No. 202080003681.0, issued Aug. 18, 2023 with translation, 22 pages.
International Preliminary Report on Patentability and Written Opinion for International Application No. PCT/EP2020/074075, issued Mar. 1, 2022, 9 pages.
Korean Notice of Grounds for Preliminary Rejection for Korean Application No. 10-2020-7037108, dated Jun. 28, 2022, with translation, 45 pages.
Japanese Notice of Reasons for Refusal for Japanese Application No. 2022-134931, dated Oct. 5, 2023, with translation, 8 pages.
Taiwanese Office Action and Search Report for Taiwanese Application No. 109129445, dated Jan. 4, 2024 with translation, 35 pages.
Office Action (Communication pursuant to Article 94(3) (EPC) issued Apr. 2, 2025, by the European Patent Office in corresponding European Patent Application No. 22 186 755.9-1211. (6 pages).
Esko.com; FTA Technical Innovation Award, May 2, 2017. https://www.esko.com/en/company/press-releases/2017/fta-award-xps-crystal-5080.†
SableLED Installation Manual. Printed 2017. Wildfire Inc.†
Integration Technology Ltd.; Solidcure 2 Addressable Range Operating & Maintenance Manual, M150; V5.1; 2016.†

(56) References Cited

OTHER PUBLICATIONS

Asmetec; dated of Jul. 12, 2019; https://www.asmetec-shop.de/en/led-tube-uv-365-nm-150-cm-25-watt-clear-uv-raditation-365-nm-3000-Im.html.†

Vianord Engineering; Spare Parts Manual Version 1.0; Evo3 A: pp. 13 to 37.†

Asmetec Technical Products & Services; Declaration of Conformity; Jul. 12, 2019.†

Asmetec; dated of Jul. 12, 2019; https://www.asmetec-shop.de/en/led-tube-uv-365-nm-150-cm-25-watt-clear-uv-raditation-365-nm-3000-lm.html.†

Solidcure 2 Addressable Range Operating & Maintenance Manual. M150, V5.1, 2016, Integration Technologies Ltd.†

Vianord Engineering Spare Parts Manual Version 1.0 (Jun. 20, 2017), pp. 13 to 37.†

Asmetec Technical Products & Services; LED Tubes sale information, Feb. 27, 2023, www.asmetec-shop.de/LED-illumination/LED-Tubes.†

Esko.com; XPS Crystal Touch, May 2, 2017; www.esko.com/en/company/press-releases/2017/fta-awards-xps-crystal-5080.†

Wildfire Inc.; SableLED; Installation Manual 365nm Linear Ultraviolet LED Lamps;: L15T9/BLB, L30T9/BLB; 2017.†

NExT Press Release; May 31, 2013.†

Introducing SableLED; Finally, A Viable Inexpensive UV-LED Upgrade path for UV Fluorescents, Jun. 29, 2016; Wildfire Inc. https://wildfirelighting.com/introducing-sableled-finally-a-viable-inexpensive-uv-led-upgrade-path-for-uv-fluorescents/.†

NExT; New! Flint Group presents nyloprint NExT Exposure for letterpress printing plates; Press Release; May 31, 2013.†

Wildfire Inc.; Introducing SableLED—Finally, A Viable Inexpensive UV-LED Upgrade Path for UV Fluorescents; Jun. 29, 2016.†

\* cited by examiner
† cited by third party

UV LED RADIATION SOURCES FOR USE IN PHOTOPOLYMER EXPOSURE

CROSS-REFERENCE TO RELATED APPLICATIONS

This patent application is a U.S. National Phase Patent Application of PCT Application No. PCT/EP2020/074075, filed Aug. 28, 2020, which claims priority from U.S. Provisional Application Ser. No. 62/893,395, titled UV LED RADIATION SOURCES FOR USE IN PHOTOPOLYMER EXPOSURE, filed Aug. 29, 2019, incorporated herein by reference in its entirety.

BACKGROUND OF THE INVENTION

Fluorescent tubes have been used for decades in the business of photopolymer curing. In the most embodiments, some 10 to 30 of these tubes are combined next to another in one plane in close proximity and parallel to the photopolymer plate to build a light source that covers the entire photopolymer plate. These systems are commonly called "bank light systems" or "flood" light systems. A common standard system is for example the ECDFL 1000 system from DuPont. A common fluorescent tube for this purpose is for example the TL 80/10-R SLV/25 from Philips. An exemplary drawing of such a prior art fluorescent tube is depicted in FIG. 8. As is well known in the art, exemplary fluorescent tubes have opposite end caps 810 (which are typically metal), two pin connectors 812 extending from each end cap, and a luminescent portion 814 between the end caps. Such tubes may be characterized by their diameter D, length A between opposite end caps 810, length C between the ends of the prongs 812 extending from the end caps, with each prong having a length (C-B). Exemplary published dimensions of the TL 80W/10-R SLV/25-model tube are shown below in Table 1:

TABLE 1

| D (max) | A (max) | B (max) | B (min) | C (max) |
|---|---|---|---|---|
| 40.5 mm | 1500 mm | 1507.1 mm | 1504.7 mm | 1514.2 mm |

The foregoing dimensions are only one example, and various tube manufacturers and bank light systems may employ tubes having different dimensions. The spacing between the pins and geometry of the pins may also have a predetermined dimension (not shown).

Bank Light systems with fluorescent tubes have disadvantages, including:
- power consumption is high compared to LEDs;
- short-term output often drifts after the lamp has been turned on;
- to avoid output drifting, tubes are often operated in stand-by mode, which consumes additional energy
- light output is not constant over lifetime of the bulbs;
- after 500 and 1000 hours, UV output may decline such that curing results become inacceptable;
- frequent exchange of the tubes adds cost;
- mercury content of the tubes is environmental problematic.

LEDs have advantages over fluorescent tubes, including but not limited to lower power consumption, slower aging, more stable UV Output over temperature, and no warmup phase. While UV output of LEDs also decays over the lifetime of an LED, the lifetime of an LED is about one order of magnitude higher than fluorescent tubes, LED output is much more stable after turning on. Accordingly, to reap the benefits of these advantages, almost all system manufacturers in the field of flexographic printing have introduced their own commercial UV LED exposure systems that use LEDs. These commercial systems are typically based on relative motion between the photopolymer plate and the light source. Usually the LEDs are arranged in a row that extends over one dimension of the plate while the other dimension is exposed by relative movement between the light source and the plate. A significant portion of the cost of such systems relates to the mechanics required to create the relative movement between the plate and the UV source. Further costs arise from the need for cooling LEDs concentrated in rather small area. Still more costs are incurred by the complex driving electronics needed to balance and control the UV Output of LEDs.

As UV LEDs have become increasingly less expensive, it is now more economically favorable to use UV LEDs in an array having a length and width at least as large as the sire of the printing plate to be exposed, such as is described, for example, in PCT Published Patent Application No. WO2017072588A1, dated May 4, 2017, filed by the common Applicant as this application.

While a direct replacement of fluorescent tubes with tubes containing LEDs in the visible range for lighting purposes has been described in the art, such as for example in U.S. Pat. No. 7,507,001, incorporated herein by reference, in view of the advantages of LEDs and their decreasing cost, there is now also an increasing interest in incorporating UV LEDs in photopolymer curing applications.

SUMMARY OF THE INVENTION

One aspect of the invention comprises a radiation source for curing a photopolymer printing plate with actinic radiation. The source includes a base comprising a heat sink and having a width and a length along an axis, wherein the length is greater than the width. One or more circuit boards is mounted on the base, the one or more circuit boards collectively having a plurality of light emitting diodes (LEDs) distributed over the length of the base, each LED configured to emit actinic radiation in a direction toward a target illumination plane at an emission angle. A cover transparent or translucent to the actinic radiation and mounted on the base together with the base defines an enclosure for the plurality of LEDs. The source may be configured to provide the actinic radiation at an emission angle greater than an emission angle of a single LED in a first plane perpendicular to the axis of the base, greater than an emission angle of a single LED in a second plane containing the axis of the base or parallel to the axis of the base and perpendicular to the target illumination plane, or a combination thereof. In one embodiment, the cover may comprise one or more prismatic and/or refractive structures, such as in the form of a Fresnel lens. The source may be configured to replace a fluorescent bulb having a specified length and a set of electrical connectors at opposite ends configured to mount in respective sockets, the source having said specified length and set of electrical connectors configured to mount in the respective sockets. The source may include control electronics for controlling output of the plurality of LEDs disposed in said source, such as but not limited to a remote control receiver connected to the control electronics and configured to receive a signal for operating the control electronics.

In one embodiment, the base may comprise a plurality of surfaces angled relative to one another and disposed parallel to the axis of the base, with a subset of the plurality of LEDs and corresponding one or more circuit boards or a portion thereof mounted on each of the plurality of surfaces. At least one of plurality of surfaces is disposed parallel to the target illumination plane. In one embodiment, three such surfaces may be angled relative to one another at a reflex angle, such as for example, 210-240 degree angles.

The base may have a planar cover mounting area parallel to the target illumination plane for receiving a corresponding surface of the cover. The base and the cover may have an interface comprising one or more positive or negative features of the cover configured to mate with one or more mating features in the base. One or more clamps may hold the cover and the base in a compressive relationship.

The base may comprise at least one rectangular LED mounting surface facing the printing plate for receiving the one or more circuit boards comprising the plurality of LEDs. The heat sink may comprise an underside portion connected to an underside of the rectangular mounting surface, wherein the rectangular mounting surface has a width greater than a width of the underside portion, and the LEDs are distributed in an array including a plurality of LEDs distributed across the width of the rectangular mounting surface, such as in an array five LEDs wide. In an embodiment in which the radiation source is configured to replace a fluorescent bulb comprising a tube having a diameter, the width of the rectangular mounting surface may be greater than the diameter of the tube.

The base may comprise a front portion facing the target illumination plane, and an underside portion facing away from the target illumination plane, wherein the underside portion has a geometry that defines a semi-cylinder. In one embodiment, the heat sink may define a plurality of fins spaced apart from one another with radial edges that define the semi-cylindrical geometry.

Another aspect of the invention comprises an exposure system comprising a plurality of radiation sources as described herein. The exposure system may include a substrate for receiving a printing plate in the target illumination plane corresponding to the plurality of radiation sources. The exposure system may comprise a housing configured for use with fluorescent tubes, wherein the sources replace the fluorescent tubes. A remote control transmitter may be configured to send signals to a plurality of remote control receivers in the plurality of radiation sources, and may have one or more inputs for receiving information to be transmitted to the remote control receivers. The one or more inputs may comprise a control panel for setting a desired illumination intensity for the radiation sources. One or more photodetectors may be configured for detecting a radiation intensity emitted by one or more of the plurality of radiation sources, each photodetector configured to provide a feedback signal to the one or more inputs of the remote control transmitter, wherein the control electronics are configured to use the feedback signal for controlling the intensity emitted by the one or more of the plurality of radiation sources.

The exposure system may include a first set of sources spaced above a first surface of the substrate, and optionally, the substrate may be transparent or translucent to the actinic radiation, with a second set of sources spaced below a second surface of the substrate opposite the first surface.

In systems in which the sources replace fluorescent tubes, the sources have a predetermined spacing between axes of adjacent sources that defines a gap between adjacent edges of adjacent sources, wherein the gap between the sources is less than a corresponding gap between the fluorescent tubes the sources replace.

Yet another aspect of the invention is a method of exposing a printing plate, the method comprising placing a printing plate on the target illumination plane in an exposure system as described herein, and activating the radiation sources to provide actinic radiation directed at the plate. The method may comprise measuring irradiance at the target illumination plane and controlling intensity of the plurality of LEDs in one or more of the radiation sources based upon the measured irradiance. Controlling the intensity of the plurality of LEDs may include compensating for output power decay caused by aging of the plurality of LEDs. Controlling the intensity of the plurality of LEDs in a first source may also or instead include compensating for differences in performance characteristics of the LEDs in the first source relative to performance characteristics of a respective plurality of LEDs in a second source. Controlling the intensity of the plurality of LEDs may also or instead include adjusting radiation output according to application requirements, such as providing a first exposure characteristic for creating round top dots in the printing plate and a second exposure characteristic for creating flat top dots in the printing plate.

DETAILED DESCRIPTION OF THE INVENTION

Aspects of this application relate to apparatus and methods for using LEDs instead of fluorescent tubes in bank light tables for exposing photopolymer printing plates actinic UV radiation. In the simplest way, this can be established by providing housings that contain semiconductor LEDs and are electrical and mechanically compatible with existing fluorescent tubes, including LED-based actinic radiation sources suitable for use as replacements for existing fluorescent tubes in bank light tables. Arrays of LED light sources that cover the entire printing plate surface do not require relative motion to irradiate the entire front or back plate surface. Cooling requirements are less demanding when the heat created by the LED light sources is spread over a wide area approximately the size of the plate, instead of being concentrated on a smaller relatively linear area with high intensity to minimize travel time to reach full exposure.

One aspect of the invention comprises a UV LED Light source that covers the complete surface of a photopolymer printing plate with fluorescent tube replacements equipped with UV LEDs, and methods for retrofitting bank light exposure units by replacing all the fluorescent tubes in a bank light exposure unit by replacement tubes as described herein. While LED replacements for fluorescent tubes are known for lighting applications, photopolymer plate exposure may impart different demands and provide opportunities to use different structures.

Figure 1:
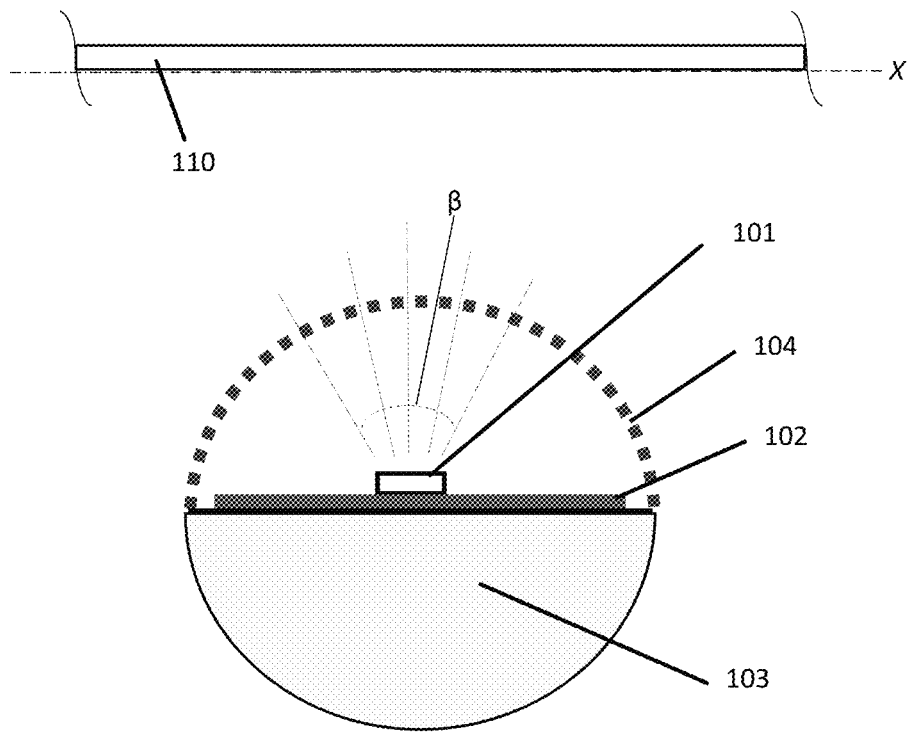
FIG. 1 is a cross-sectional schematic diagram showing an exemplary source of the present invention juxtaposed relative to a portion of an exemplary plate positioned on an illumination plane for exposure radiation from the source.

A simple embodiment is shown in FIG. 1, which shows a cross section of an exemplary LED radiation exposure source embodiment in accordance with one aspect of the invention. LED chips 101 are located on a circuit board 102 that extends along the length of the source. The circuit board is preferably mounted on a base 103 that includes a heat sink, such as made of metal, preferably aluminum. The LEDs are preferably connected in series and the opposite ends of the source have connectors configured to permit each source to be installed in a socket configured to receive a fluorescent tube. Thus, an array of sources so constructed may be mounted inside a bank light table and supplied with electrical power. The light emitting side of the source is covered by a UV-transmissive cover 104, which keeps dust and solvents away from the sensitive output windows of the UV LEDs. Suitable materials of construction for cover 104 include plastics such as polymethyl methacrylate (PMMA) (also known as acrylic, acrylic glass, or plexiglass), such as but not limited to Plexiglas® acrylic, made by Arkema France and PMMA made by Evonik, of Essen, Germany, or its successors in interest. As shown in FIG. 1, the cover has a semi-cylindrical shape that connects to a planar upper surface of base facing the illumination plane. The cover may be attached to the base in any way known in the art, including but not limited to with an adhesive, such as, for example, a UV-curable adhesive.

Figure 2:
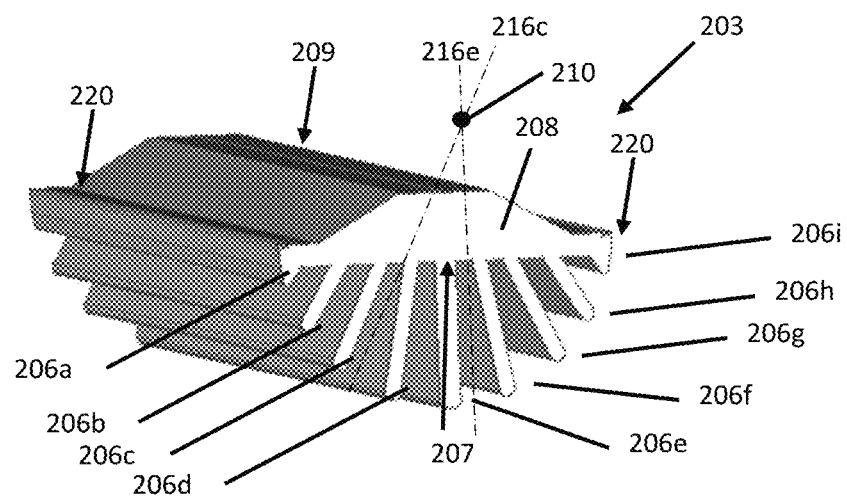
FIG. 2 is a perspective schematic diagram of an exemplary finned heat sink design with an angled mounting surface for the LEDs.

While FIG. 1 depicts the heat sink of base 103 schematically, it should be understood that the heat sink may have any geometry suitable for providing a desired degree of heat transfer in use. FIG. 2 depicts an exemplary aluminium base 203 comprising a heat sink having a plurality of cooling fins 206a-i. Most bank light tables are equipped with fans that remove the waste heat from the rear side of the fluorescent tubes, meaning that the convective air current supplied by the fans may be particularly well suited for cooling a source having a heat sink comprising a plurality of fins. Although shown in a design comprising a semi-cylindrical distribution of fins emanating from a horizontal surface 207 of base 208 with each fin extending along a radius, the heat sink is not limited to any particular geometry. In one exemplary geometry, however, some or all of the radii may emanate from a common center point 210 that is spaced above the horizontal surface at an intersection of center lines of the fins (e.g. center lines 216c, 216e of respective fins 206c, 206e, as depicted). One or more of the fins, such as central fin 206e, may be relatively thicker than others 206b-d,f-h, and end fins 206a, 206i may attach to the horizontal surface 207 of the base on one side and have a gap separating them from adjacent fins 206b, 206h on the opposite side. Although shown with base 208 having a polygonal upper surface 209, as described further with respect to the embodiment discussed with reference to FIG. 3, upper surface may be flat, as depicted schematically for base 103 in FIG. 1. The upper surface of the base may include connection areas 220 on opposite sides for receiving the cover, each connection area defining a plane that is parallel to the target illumination plane.

One advantage of fluorescent tubes over LEDs is their wide light emission angle range. The fluorescing coating at the walls of fluorescent tubes emits photons into all directions making fluorescent tubes a nearly ideal area source, which is desirable when exposing photopolymer printing plates through a mask. LEDs are in the nature of point sources and thus less ideal from this perspective, as each LED emits radiation at a relatively narrow emission angle β toward target illumination plane X (e.g. the top surface of a printing plate 110), as depicted in FIG. 1.

Certain measures may be employed to sufficiently overcome this flaw and broaden the angle distribution of the radiation, including but not limited to:
- using a relatively greater number of evenly distributed, relatively lower power LEDs, instead of a relatively lesser number of relatively higher power LEDs;
- arranging LEDs in groups of different tilting angles;
- using reflective optics, such as but not limited to a kaleidoscope, to convert point sources into area sources
- using transmissive optics, such as but not limited to Fresnel lenses or diffusor plates.

The number of LEDs per tube length is a parameter that may be used to characterize distribution of light along the length axis of the sources. A source rated to deliver 20 Watts of UV power may, for example, comprise 20 LEDs each having an output of 1 Watt arranged along the source length, or more preferably, 40 LEDs each having an output of 0.5 Watts, or even more preferably, 60 LEDs each having an output of 0.33 Watts.

Figure 3:
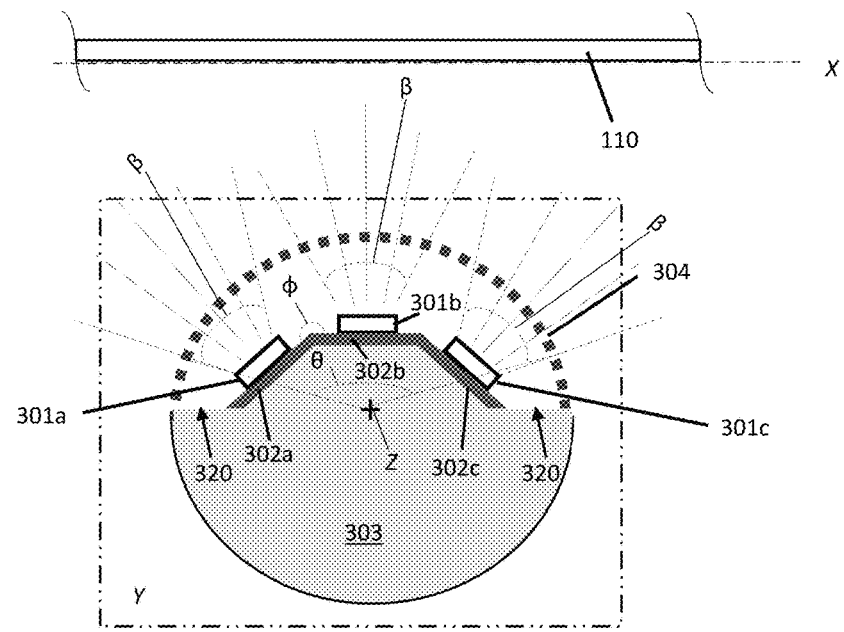
FIG. 3 is a cross-sectional schematic diagram of an exemplary source with LEDs mounted on an angled mounting surface juxtaposed relative to a portion of an exemplary plate positioned on an illumination plane for exposure radiation from the source.

FIG. 3 depicts an embodiment with LEDs 301a-c arranged on corresponding circuit boards 302a-c disposed on an upper surface of base 303 at angles relative to one another. Such a configuration improves the angle distribution in the illumination plane Y perpendicular to the length axis Z of the tube, with minimal to no impact on the angle distribution in planes parallel to or including the tube length axis (which planes are perpendicular to both plane Y and plane X on which the plate lies). Thus, while each source 301a-c still only has an emission angle β, the three sources together create a total emission angle for the source of θ, which is greater than β. The shape of the upper surface of the heat sink as depicted in FIG. 3 is semi-hexagonal, with three angled surfaces each offset at a reflex angle relative to one another (e.g. preferably at an angle in which Φ=210-240 degrees, as depicted in FIG. 3). More than three surfaces angled relative to one another may be provided. Preferably, however, regardless of the number of surfaces, at least one of the surfaces is parallel to the target illumination plane. The connection areas 320 for receiving the opposite edges of the cover 304 are also preferably planar surfaces parallel to the target illumination plane X and configured to receive corresponding planar surfaces of cover 304. The interface between cover and base is not limited to any particular configuration, however. Thus, odd numbers of angled surfaces are preferable. The base is preferably configured so that all of the circuit boards lay flat on the corresponding surfaces of the base for maximum heat conduction through the heat sink. While base 303 is preferably configured so that the planes corresponding to circuit boards 302a and 302c intersect the plane corresponding to circuit board 302b at equal angles, Φ may be greater than or less than in the range of 120-150 degrees in other embodiments. Θ may be a multiple of β that is equal to the number of surfaces, or some fraction thereof. Θ is preferably less than 180 degrees, to increase the percentage of overall radiation emitted by the LEDs toward the printing plate.

Figure 4:
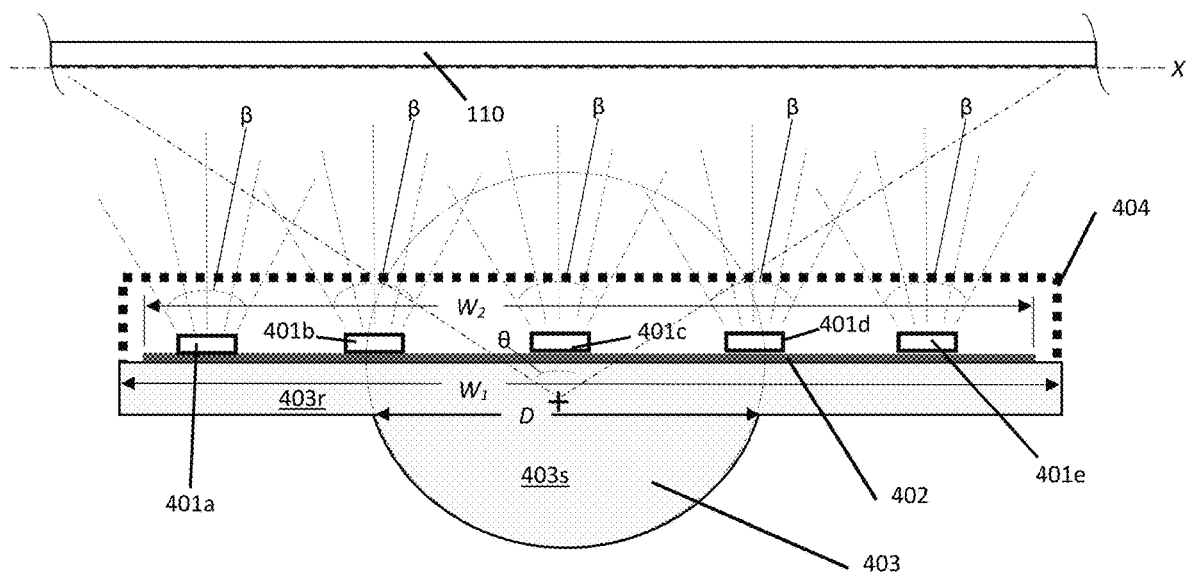
FIG. 4 is a cross-sectional schematic diagram of an exemplary source having a relatively wide rectangular array of LEDs juxtaposed relative to a portion of an exemplary plate positioned on an Illumination plane for exposure radiation from the source.

FIG. 4 depicts an embodiment in which the base 403 and the circuit board 402 have widths $W_1$ and $W_2$, respectively, on the front facing side of the base greater than the original diameter of the fluorescent tube that the source is designed to replace. Cover 404 may be generally rectangular in nature, although not limited to any particular geometry. This configuration also includes the plurality of LEDs 401a-e configured in an array over a width that includes at least some LEDs (e.g. 401a, 401e) in locations in the gaps between the fluorescent tubes the sources replace. For comparison purposes, dimension D of the semi-circular underside portion 403s of the base where it connects to the rectangular portion 403r is depicted as approximately the same size as the original diameter of the fluorescent tube that it replaces. Dimension D may be a chord that is smaller than the actual diameter of the semi-circular portion and/or the original diameter or the fluorescent tube. The heat sink may have a semi-circular portion with a diameter smaller or larger than the original fluorescent tube. The geometry of the underside portion is not limited, however, and some embodiments may not have a semi-circular geometry at all. The extended width of the source may be designed such that adjacent sources replace adjacent tubes in a one-to-one ratio with little to no gap between the adjacent lateral of the adjacent sources, or each source may be designed to take the pace of multiple fluorescent tubes (e.g. 1 LED source to 2 fluorescent tubes, 1 to 3, etc.). This configuration also has the effect of providing an emission angle θ from the source that is greater than the individual emission angle β of each LED.

Figure 5A:
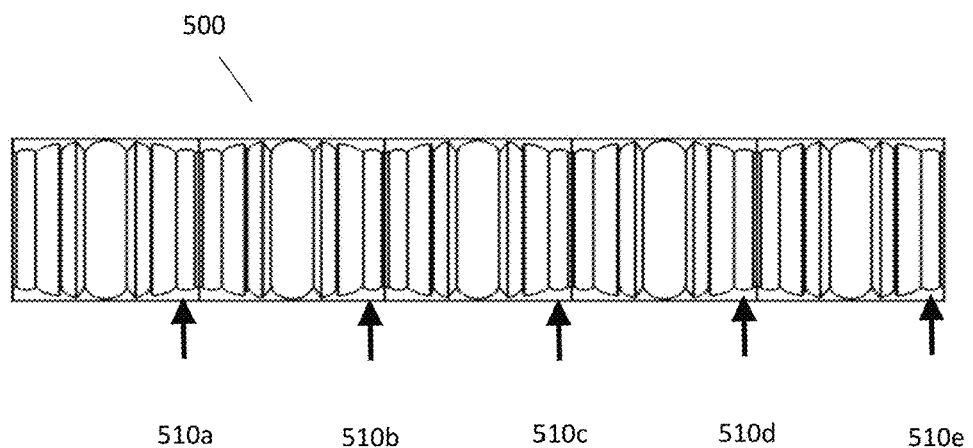
FIG. 5A is a schematic plan view of an exemplary cover embodying a plurality of cylindrical Fresnel lenses.
Figure 5B:
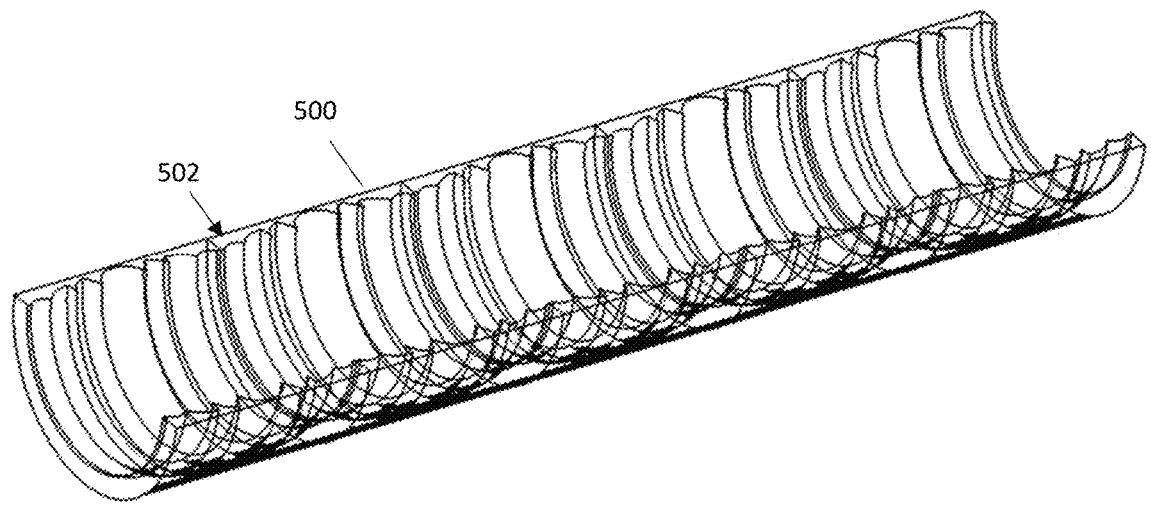
FIG. 5B is a perspective view of the cover of FIG. 5A.

To improve the angle distribution in planes parallel to or containing the tube length axis, cover 104 shown in FIG. 1 may comprise prismatic or other refractive structures, such as a plurality of cylindrical Fresnel lenses, over the locations where LEDs are located. FIGS. 5A and 5B depict an exemplary portion of such a cover 500 having five cylindrical Fresnel lenses aligned over five LED linear positions represented by arrows 510a-e. As used herein, the term "cylindrical Fresnel lens" refers to a lens geometry having refractive force that condenses or diffuses light to or from a line (e.g. the axis along which the LED sources are distributed) as opposed to a spherical Fresnel lens that condenses or diffuses light to or from a point. Each LED linear position may represent more than one LED, such the angled distribution of three LEDs depicted in FIG. 2. The structures in cover 500 may comprise prismatic structures that are not exactly in compliance with the mathematical precision of a Fresnel lens, but which still refract the UV radiation in a way that causes an angle distribution that is wider than without such structures. Thus, the prismatic, refractive structures in the lens cover are not limited to any particular geometry.

Figure 5C:
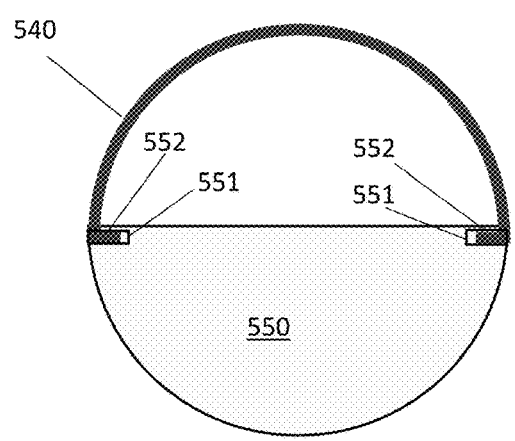
FIGS. 5C-5H illustrate schematic plan views of exemplary interfaces between cover and base structures.

Notably, the cover 500 as depicted in FIG. 5B has planar surfaces 502 on opposite ends configured to interface with the planar mounting area 220, 320 as depicted in FIGS. 2 and 3. Thus, when assembled to a corresponding base, planar surfaces 502 are parallel to the target illumination plane. Planar surfaces on the ends of the cover may be present in any cover structure such as any of those depicted in any of the other embodiments discussed herein. In alternative configurations, the cover may have one or more protrusions that interface with mating grooves or holes in the base. For example, in one alternative configuration, depicted in FIG. 5C, the base 550 may have a groove 551 configured to receive a lip 552 extending radially inward from the ends of the cover 540. The groove and corresponding lip may extend the full length of the source, or may be present in only select mating locations. The strength of the physical connection between the groove and the lip may be enhanced by the use of adhesive on the mating surfaces of the lip and groove. The geometry of the groove and lip may have any geometry known in the art and are not limited to those depicted. The interface between the cover and the base is not limited to any particular structure. Additional interfaces may be provided, such as the interfaces depicted in FIGS. 5D-5H, as non-limiting examples.

Figure 5D:
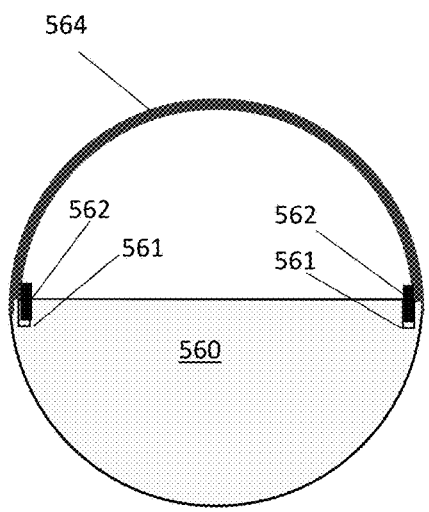

As depicted in FIG. 5D, base 560 may have one or more grooves or holes 561 into which prongs or tabs 562 protruding from cover 564 are inserted. These interfaces may be strengthened with adhesives. Although the width of the base and the cover are depicted as being substantially the same at the interface in FIG. 5D, base 590 may have a greater width than the cover 594 at the interface, such as is shown in FIG. 5G, wherein the prongs or tabs 592 comprise projections extending from the cover 594 at the same width or diameter as the cover and the base has corresponding grooves or holes 591 in the relatively larger landing area of base configured to receive corresponding prongs or tabs.

Figure 5E:
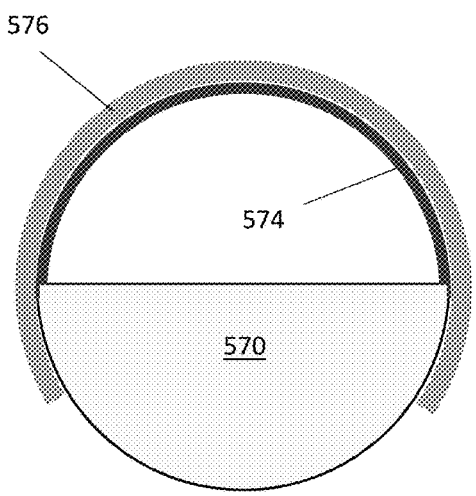
Figure 8:
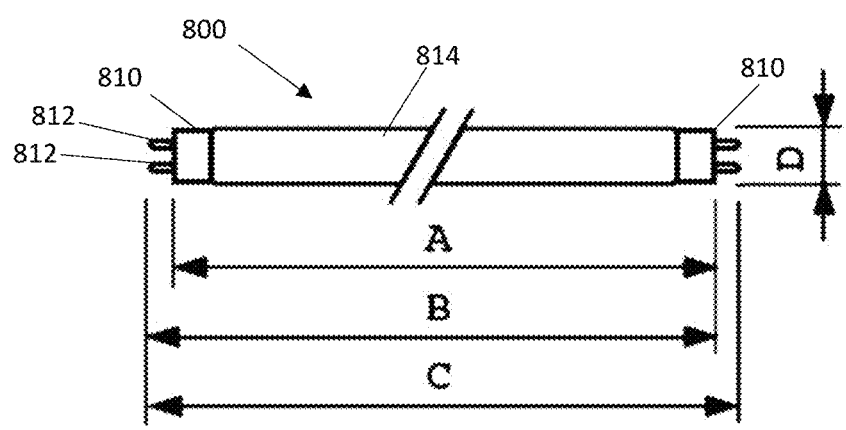
FIG. 8 is a schematic plan view of an exemplary fluorescent bub of the prior art.

In another embodiment, clamps 576 (such as made from spring steel) may be disposed around portions of the cover 574 and extending below the base 570, as depicted in FIG. 5E. Such clamps may be preferably located where end caps 810 on the prior art bulbs are shown in FIG. 8, so that the any radiation blocked by the clamps is not required for curing exposure.

Figure 5F:
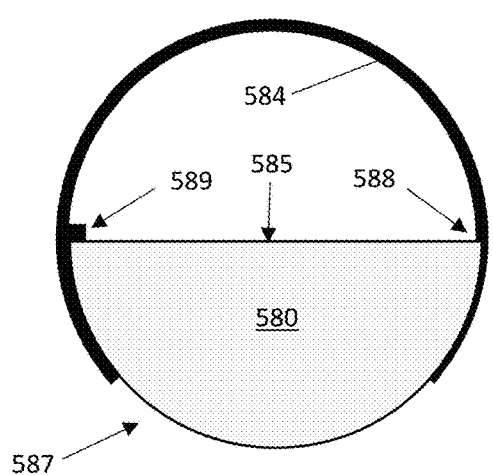
Figure 5G:
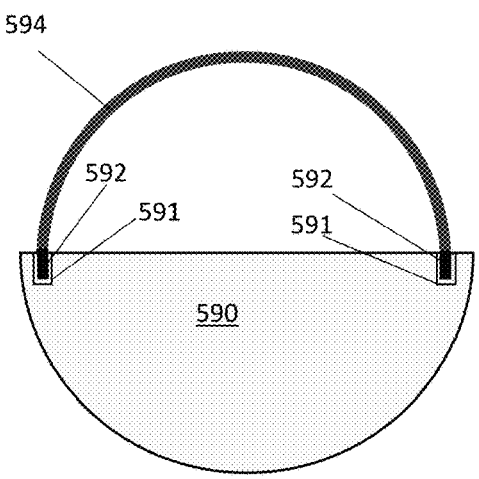

In still other configurations, such as depicted in FIG. 5F, the cover 584 may comprise a portion of a Plexiglas tube extending for more than 180 degrees in cross section, with rear openings in the tube 587 provided for cooling. The tube may have a first thickness in the front-facing portion of the tube and a lesser thickness in contact with the periphery of the base 580 such as to provide a lip 588 as depicted on the right side in FIG. 5F that interfaces with front facing surface 585, or the tube may have a protrusion 589 that contacts the front facing surface of the base. Although depicted with different structures on the right and left side in FIG. 5F, it should be understood that the drawing is for illustrative purposes only, and that the opposite sides of the cover and the base typically have the same structural features, although the structure may comprise a combination of change in wall thickness and protrusion and some embodiments may have different structures on one side versus another to facilitate assembly.

Figure 5H:
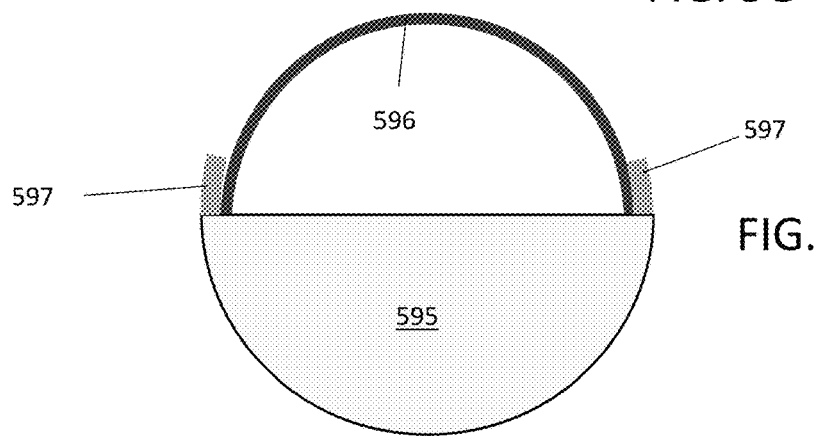

Although depicted as protrusions or other positive features on the cover that interface with holes, grooves, or other negative features in the base, embodiments which the cover in with positive features on the base may also be provided, such as is depicted in FIG. 5H, in which projections 597 from base 595 receive the edges of cover 596. The projections may extend the entire length of the cover and base, or may comprise a series of discrete protrusions. The cover may have a continuous edge of the same thickness throughout, or may have indentations or areas of relatively thinner and thicker wall thickness to mate with corresponding protrusions from the base. A layer of adhesive may be provided between the mating surfaces of the base and the cover.

Clamps and/or adhesive may be combined with any of the interfaces as described herein, and combinations of negative, positive, or neutral features of the cover that interface with corresponding mating features of base may be combined, including but not limited to any or all of the following as described herein. As used herein the term "positive" is intended to refer to a feature that protrudes from an edge or surface, the term "negative" is intended to refer to a feature that is indented relative to an edge or a surface, and "neutral" is intended to refer to a feature that is neither positive or negative, such as a feature that makes planar contact with a corresponding feature. A "mating" feature may comprise, for example, a positive feature, such as a prong 562, that fits in a negative feature, such as a hole 561, or a positive 589 or negative 588 feature (e.g. an area of reduced wall thickness), or combination thereof, that creates a lip, which receives a neutral surface (e.g. base front-facing surface 585). Although depicted with semi-cylindrical covers in FIGS. 5C-5H, it should be understood that any of the interfaces between the cover and the base may also be applicable to embodiments having other shapes, such as but not limited to the rectangular cover geometry depicted in FIG. 4.

Preferably the LEDs in each single source are selected from the same production batch such that the light output properties (and any other material characteristics) of those LEDs are sufficiently the same to obtain a constant UV output over an entire length of the source. Not all LEDs in all of the sources in one bank exposure unit can be produced from the same LED batch, thus it is may be desirable to have control electronics that maintain a desired current through the LEDs to compensate for different output intensities emitted from different LED batches per unit current. Using such control electronics, the total UV output of all tubes may be adjusted to a common level of intensity within a predetermined tolerance such that all locations on the plate are exposed to the same intensity levels of UV radiation within the desired tolerance.

Suitable control electronics for controlling LEDs and LED intensity are well known in the field of lighting technology, such as the use of pulse width modulation for obtaining acceptable linearity of UV output versus control signal. Remote control signals may be used for setting the output of the LED sources, such as to compensate for output power decay caused by aging. Control signals may be transmitted to individual power controllers located in each source, such as by means of Infrared (IR) or Radio Frequency (RF) signals. Remote control of the radiation intensity may also permit adjustment of radiation output according to application requirements, such as for exposing highly sensitive Polymer plates (e.g. DuPont® EFX plates) in round top vs. flat top mode, as is known in the art. Adjusting radiation output according to application requirements may also include providing a first exposure with low intensity followed by a second exposure with higher intensity for complete curing of the printing plate. The first exposure may provide a first fraction of the required total curing, wherein the second exposure provides the remaining fraction of the required total curing, such that the first and second exposures together collectively provide the total amount of energy required to cure the plate.

Figure 6:
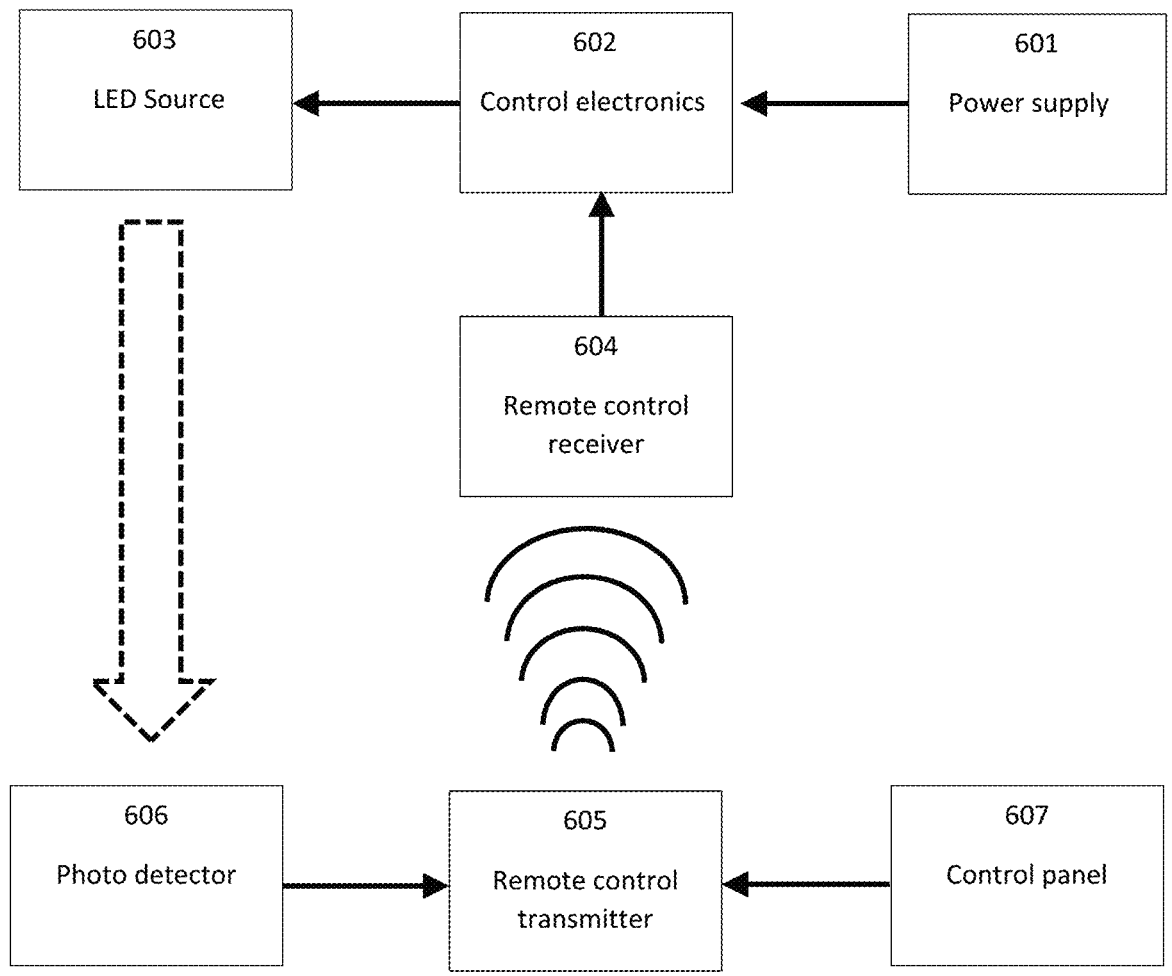
FIG. 6 is a schematic diagram of an exemplary control system for controlling exemplary systems incorporating the sources as described herein.

To compensate for non-linearities in the electronics or the control curve for dimming LED sources, one or more photodetectors integrated in or placed on the support plane that holds the photopolymer plate during exposure may provide feedback to the UV output controller so that a precise amount of UV intensity is provided, within a predetermined tolerance. FIG. 6 schematically illustrates an exemplary such feedback loop, as well as a general schematic for controlling an exemplary LED source as described herein. Power supply 601 powers control electronics 602 that control the LEDs in each LED source 603. The individual LEDs in each source may be individually controllable, or more preferably, may be controllable as a unit. Photodetector 605 measures the radiation received at a location calibrated to represent that radiation received by the printing plate, a signal from the photodetector is then provided to a remote control transmitter 605 that sends a signal to remote control receiver 604 connected to the control electronics, which uses that feedback signal as an input for determining whether the current should be increased, decreased, or maintained without change. Control panel 607 may provide a desired intensity level instruction to the remote control transmitter, which may use such information as a feed forward signal to set an approximate current level that is then adjusted using feedback.

Figure 9:
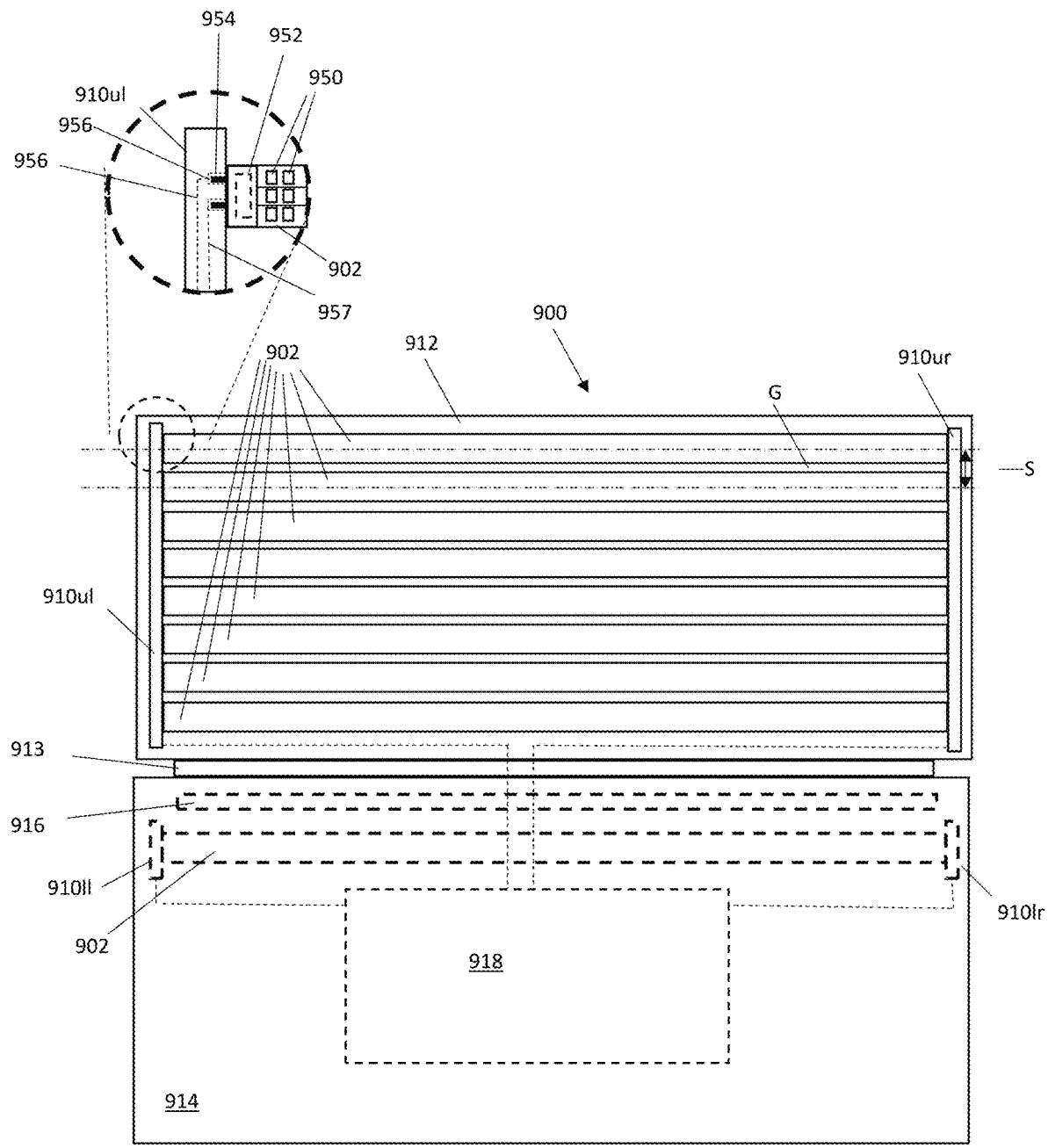
FIG. 9 is a schematic front view of an exemplary bank exposure system having plurality of exemplary sources mounted therein, including magnified portion shown an exemplary interface between the source and the system components.

FIG. 9 depicts an exemplary radiation system 900 incorporating a plurality of sources 902, which sources may be any of the configurations as described herein for replacing a fluorescent tube. The system may, for example, be a pre-existing system designed for use with fluorescent bulbs, retrofitted with sources of the present invention, which source may optionally also include any of the additional controllers and sensors as described herein. The system may also be a newly designed system for use with the sources as described herein. The exemplary system comprises a lid 912 attached to a base 914, typically by a hinge 913 or other means for permitting the lid to move relative to the base for insertion of a printing plate (not shown) on the support surface 916 for receiving the plate. Support surface 916 is generally dimensioned to have a width and length at least the same size as (and preferably greater than by a predetermined margin) the largest printing plate for which the unit is rated to expose. The array of radiation sources are correspondingly configured to provide light over the full length and width of the plate for which the unit is rated to expose, and thus also preferably sized to provide the bank or flood of light across an area slightly larger than the largest plate size by a predetermined margin.

In the exemplary configuration shown, the lid, depicted in an open configuration, has mounted therein a first plurality of upper radiation sources 902, having a spacing S on-center relative to the axes of the sources. The number of upper radiation sources 902 shown is not intended to be representative of an actual number of sources or relative sizes of sources in a typical system, but is merely shown schematically for reference. Furthermore, as depicted, the width/diameter of the sources is depicted as to leave a gap G between adjacent sources. As discussed herein with respect to the embodiment depicted in FIG. 4, in embodiments in which the source replaces a fluorescent bulb having diameter D in which the dimension of gap G has a first value, the width of the source may be greater than D such that the dimension of gap G has a second, lesser value than the first value.

Each upper source is connected electrically and physically received in mounting units 910*ul* on the left and 910*ur* on the right side, as depicted. Each mounting unit is attached to a power supply and other controls collectively represented by block 918 mounted in base 914. As shown in the magnified portion of FIG. 9, each source 902 has end connectors 958 configured to be compatible with electrical sockets 954, which sockets may have been originally configured to receive the pins 812 of prior art tubes 800. Each socket is connected to electrical wiring connected to opposite poles 956, 957 of a power source. Each source 902 may have a local controller 952 for regulating the power to the LEDs 950. Although depicted as a box 952 located on one end of the tube, components of the controller may be disposed in both ends, or the controller may comprise components housed on the circuit boards to which the LEDs are mounted and may not be a discrete component as depicted. As is known in the art, however, the end caps 810 of fluorescent bulbs are typically metal and thus, non-luminescent, so the replacement tubes do not necessarily need to provide illumination in this region to replicate fluorescent tube performance. This makes this portion of the tube an ideal location for electronic components that may be required to control, power, or operate the LEDs in a desired manner. Controls for operating an LED source retrofitted within a system configured to receive fluorescent tubes, as well as any other modifications to the system for generally powering such LED sources, are generally known in the art, such as are described in U.S. Pat. No. 7,507,001. Although source 902 as depicted in the magnified portion has a configuration consistent with the embodiment depicted in FIG. 3, the source may have a design in conformance with any of the sources as described herein.

An exemplary control system may include one or more controllers collectively programmed with some or all the features depicted in FIG. 6 and described herein above. The location of the power supply and controls is not limited to placement in the base, and may be located elsewhere, including in a distributed arrangement in which some parts of the control system are mounted in the base, some in the lid, and some in the source, as described herein. The lines shown connecting block 918 denote electrical connections (which are wired connections) as well as control signal connections (which may be wired or wireless). As depicted, sources 902 in the lid may preferably be used for front side exposure of a plate mounted on support surface 916.

The support surface 916 in the base may optionally be transparent or translucent to the actinic radiation, and an additional optional bank of sources 902 may be mounted between lower left side socket 910*ll* and lower right side socket 910*lr* beneath the support surface, for providing back-side exposure. The control system may have a controller programmed to provide a combination of back side and front side exposure to the plate with a predetermined delay between front and back exposure, including in a plurality of fractional exposure cycles and/or including one or more back-side only exposure steps, as generally described in U.S. Published Patent Application Ser. No. 20180210345A1, titled PROCESS AND APPARATUS FOR CONTROLLED EXPOSURE OF FLEXOGRAPHIC PRINTING PLATES AND ADJUSTING THE FLOOR THEREO, listing the common applicant of the instant application, incorporated herein by reference.

Thus, a user may expose a printing plate using the exemplary exposure system by placing the plate on the support surface, closing the lid, and activating the upper, and optional lower, sources for a desired amount of time, including in a desired pattern of exposure as described further below. The method of exposure may include controlling the intensity emitted by the LEDs using the control system as depicted in FIG. 6 for any of the reasons as discussed herein.

Figure 7:
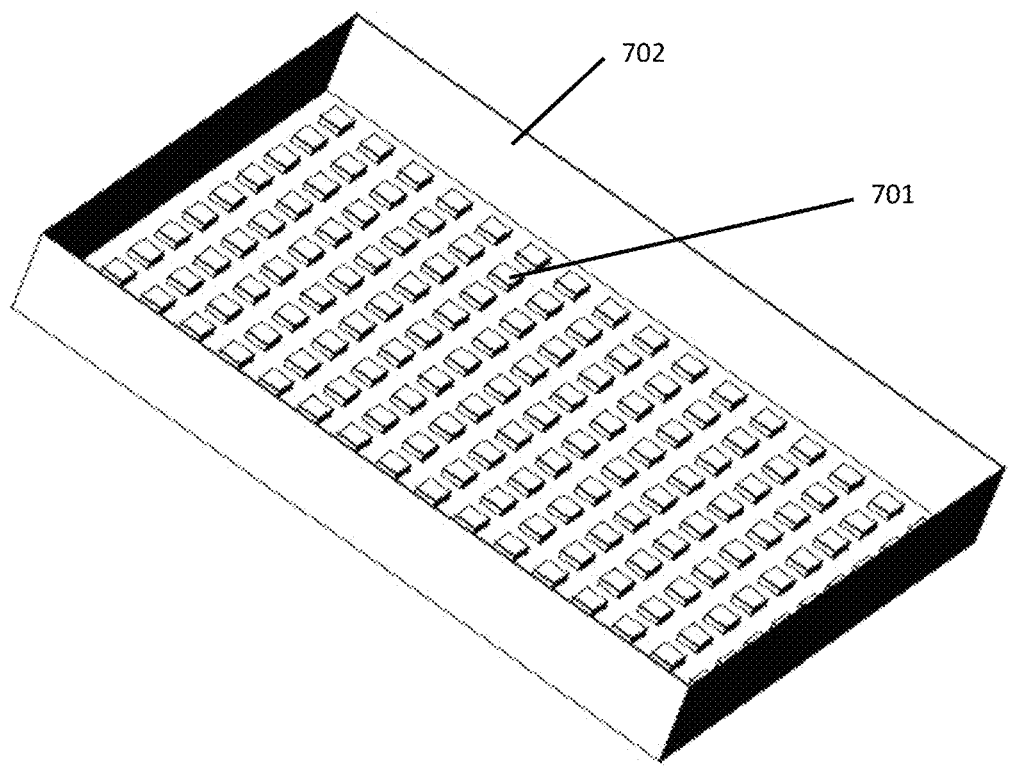
FIG. 7 is a schematic perspective diagram of a rectangular array of LEDs with reflective side walls surrounding the array.

In other embodiments, the UV LEDs 701 may be arranged in a planar array, as depicted in FIG. 7, which array may be the same size or preferably at least slightly larger than the photopolymer printing plate to be irradiated. To maintain the irradiance at the edges of the LED array, the array may be surrounded by mirrored walls 702, such as is generally disclosed in U.S. Pat. No. 6,578,854, incorporated by reference herein. As depicted, the mirrored walls are adapted for the size of a planar array. A kaleidoscope approach is also disclosed in U.S. Pat. No. 8,578,854, owned by the common applicant of this application, and incorporated herein by reference. FIGS. 3-6 of U.S. Pat. No. 8,578,854 and the corresponding disclosure illustrate advantages to using an area source for the curing of printing dots in photopolymer plates. Area sources cure a wider support socket under the printing details at the plate top surface. Wider support sockets permit smaller printing details to take hold on the plate during the solvent washing process and also provide longer run time of the plates in the press before dots break off.

Although discussed herein primarily in the context of LEDs in the ultraviolet (UV) range of emission (e.g. having a center emission wavelength in the ultraviolet UV spectrum, preferably in a range of 320 nm to 420 nm, more preferably in a range of 360 nm to 420 nm), the radiation output of the LEDs is not limited to any particular wavelength, so long as it is actinic radiation with respect to the photopolymer plate sought to be cured. It should also be understood that although the rectangular array is depicted as a regular array of rows and columns in FIG. 7 the array of LEDs may have a staggered configuration from row to row or column to column. Furthermore, each source may include more than one species of LED, each species having a different common center emission wavelength with respective species disposed adjacent to one another in a repeating sequence. For example, the LEDs may be distributed in patterns and/or have wavelength characteristics as described in PCT Application Ser. No. PCT/EP20/061556, filed Apr. 26, 2020, which claims priority from U.S. Provisional Patent Application Ser. No. 62/839,171, filed Apr. 26, 2019, both titled APPARAUS AND METHOD FOR EXPOSING PRINTING PLATES USING LIGHT EMITTING DIODES, filed by the common Applicant of the present invention, incorporated herein by reference. Different species or distribution patterns of LEDs as described in the foregoing may be used in any of the embodiments depicted herein. Thus, for example, only cross-sectional drawings have been provided for the embodiments depicted in FIGS. 1, 3 and 4, it should be understood that the LEDs are distributed along the length of each source, and such distribution may be in a regular rectangular array, or in any other spacing pattern found to have operative advantages, including but not limited to patterns of single or multiple species in accordance with any of the patterns disclosed in the foregoing 62/839,171 application.

Although discussed herein with reference to use of the sources as replacement for fluorescent bulbs and to retrofitting pre-existing bank light systems for exposing photopolymer plates with the sources as disclosed herein, it should be understood that the sources and systems for using them may comprise original equipment designed for any use, without limitation to retrofit applications.

Although the invention is illustrated and described herein with reference to specific embodiments, the invention is not intended to be limited to the details shown. Rather, various modifications may be made in the details within the scope and range of equivalents of the claims and without departing from the invention.

In view of the above, the present application discloses aspects and/or embodiments as described in the following itemized list:

1. A radiation source for curing a photopolymer printing plate with actinic radiation, the source comprising:
a base comprising a heat sink, the base having a width and a length along an axis, wherein the length is greater than the width;
one or more circuit boards mounted on the base, the one or more circuit boards collectively having a plurality of light emitting diodes (LEDs) distributed over the length of the base; and
a cover transparent or translucent to the actinic radiation and mounted on the base, the cover together with the base defining an enclosure for the plurality of LEDs.

2. The radiation source of item 1,
wherein each LED is configured to emit actinic radiation in a direction toward a target illumination plane at an emission angle, and the source is configured to provide the actinic radiation at an emission angle greater than an emission angle of a single LED in a first plane perpendicular to the axis of the base, greater than an emission angle of a single LED in a second plane containing the axis of the base or parallel to the axis of the base and perpendicular to the target illumination plane, or a combination thereof.

3. The radiation source of any one of the preceding items, wherein the LEDs have an ultraviolet center emission wavelength.

4. The radiation source of any one of the preceding items, wherein the base comprises a plurality of surfaces angled relative to one another and disposed parallel to the axis of the base, with a subset of the plurality of LEDs and corresponding one or more circuit boards or a portion thereof mounted on each of the plurality of surfaces.

5. The radiation source of any one of the preceding items, wherein at least one of plurality of surfaces is disposed parallel to the target illumination plane.

6. The radiation source of any one of the preceding items, wherein the plurality of surfaces comprises three surfaces.

7. The radiation source of any one of the preceding items, wherein the three surfaces are angled relative to one another at reflex angle.

8. The radiation source of any one of the preceding items, wherein the reflex angle is in the range of 210-240 degrees.

9. The radiation source of any one of the preceding items, wherein the base comprises a planar cover mounting area for receiving a corresponding surface of the cover, wherein the planar cover mounting area is parallel to the target illumination plane.

10. The radiation source of any one of the preceding items, wherein the base and the cover have an interface comprising one or more positive or negative features of the cover configured to mate with one or more mating features in the base.

11. The radiation source of any one of the preceding items, further comprising one or more clamps configured to hold the cover and the base in a compressive relationship.

12. The radiation source of any one of the preceding items, wherein cover comprises one or more prismatic and/or refractive structures.

13. The radiation source of any one of the preceding items, wherein the cover comprises one or more cylindrical Fresnel lenses.

14. The radiation source of any one of the preceding items, wherein the base comprises a rectangular LED mounting surface facing the printing plate for receiving the one or more circuit boards comprising the plurality of LEDs.

15. The radiation source of any one of the preceding items, wherein the heat sink comprises an underside portion connected to an underside of the rectangular mounting surface, wherein the rectangular mounting surface has a width greater than a width the underside portion and the LEDs are distributed in an array including plurality of LEDs distributed across the width of the rectangular mounting surface.

16. The radiation source of any one of the preceding items, wherein the array is five LEDs wide.

17. The radiation source of any one of the preceding items, wherein the source is configured to replace fluorescent bulb comprising a tube having a diameter, and the width of the rectangular mounting surface is greater than the diameter of the tube.

18. The radiation source of any one of the preceding items, wherein the base comprise a front portion facing the target illumination plane, and an underside portion facing away from the target illumination plane, wherein the underside portion has a geometry that defines a semi-cylinder.

19. The radiation source of any one of the preceding items, wherein the heat sink defines a plurality of fins spaced apart from one another with radial edges that define the semi-cylindrical geometry.

20. The radiation source of any one of the preceding items, wherein the source is configured to replace a fluorescent bulb having a specified length and a set of electrical connectors at opposite ends configured to mount in respective sockets, the source having said specified length and set of electrical connectors configured to mount in the respective sockets.

21. The radiation source of any one of the preceding items, further comprising control electronics for controlling output of the plurality of LEDs disposed in said source.

22. The radiation source of any one of the preceding items, further comprising a remote control receiver connected to the control electronic and configured to receive a signal for operating the control electronics.

23. The radiation source of any one of the preceding items, wherein the LEDs have an ultraviolet center emission wavelength, the base comprises a rectangular LED mounting surface facing the printing plate for receiving the one or more circuit boards comprising the plurality of LEDs, the plurality of LEDs are distributed in an array across the length and width of the rectangular mounting surface, the cover is rectangular, and the radiation source has a first set of electrical connectors configured to interface with a mating second set of electrical connectors for connecting and disconnecting the radiation source to a power source.

24. An exposure system comprising a plurality of radiation sources of any one of the preceding items.

25. The exposure system of item 24, further comprising a remote control transmitter for sending signals to a plurality of remote control receivers in the plurality of radiation sources, the remote control transmitter having one or more inputs for receiving information to be transmitted to the remote control receivers.

26. The exposure system of any one of items 24 or 25, wherein the one or more inputs comprises a control panel for setting a desired illumination intensity for the radiation sources.

27. The exposure system of any one of items 24-26, further comprising one or more photodetectors for detecting a radiation intensity emitted by one or more of the plurality of radiation sources, each photodetector configured to provide a feedback signal to the one or more inputs of the remote control transmitter, wherein the control electronics are configured to use the feedback signal for controlling the intensity emitted by the one or more of the plurality of radiation sources.

28. The exposure system of any one of items 24-27, wherein the exposure system comprises a housing configured for use with fluorescent tubes wherein the sources replace the fluorescent tubes.

29. The exposure system of any one of items 24-28, wherein the sources have a predetermined spacing between axes of adjacent sources that defines a gap between adjacent edges of adjacent sources, wherein the gap between the sources is less than a corresponding gap between the fluorescent tubes the sources replace.

30. The exposure system of any one of items 24-29, further comprising a sensor configured to measure irradiance emitted by each of the one or more radiation sources, and a controller configured to control intensity of each of the one or more radiation sources based upon the measured irradiance.

31. The exposure system of any one of items 24-30, wherein the controller is configured to control the intensity of a first source to compensate for a difference in performance characteristics of the first source relative to performance characteristics of a second source.

32. The exposure system of any one of items 24-31, wherein the controller is configured to control the intensity of a first source to compensate for a change in performance characteristics of the first source over time.

33. The exposure system of any one of items 24-32, comprising the plurality of radiation sources of claim 23, wherein the exposure system comprises the second set of electrical connectors and the power source.

34. The exposure system of any one of items 24-33, further comprising a substrate for receiving a printing plate in the target illumination plane corresponding to the plurality of radiation sources.

35. The exposure system of any one of items 24-34, comprising a first set of sources spaced above a first surface of the substrate.

36. The exposure system of any one of items 24-35, wherein the substrate is transparent or translucent to the actinic radiation, further comprising a second set of sources spaced below a second surface of the substrate opposite the first surface.

37. A method of exposing a printing plate, the method comprising placing a printing plate on the target illumination plane in the exposure system of any one of claims 33 to 35, and activating the radiation sources to provide actinic radiation directed at the plate.

38. The method of item 37 further comprising measuring irradiance at the target Illumination plane and controlling intensity of the plurality of LEDs in one or more of the radiation sources based upon the measured irradiance.

39. The method of any one of items 37 or 38, wherein controlling the intensity of the plurality of LEDs includes compensating for output power decay caused by aging of the plurality of LEDs.

40. The method of any one of items 37-39, wherein controlling the intensity of the plurality of LEDs in a first source includes compensating for differences in performance characteristics of the LEDs in the first source relative to performance characteristics of a respective plurality of LEDs in a second source.

41. The method of any one of items 37 to 40, wherein controlling the intensity of the plurality of LEDs includes adjusting radiation output according to application requirements.

42. The method of any one of items 37-41, wherein adjusting radiation output according to application requirements includes providing a first exposure characteristic for creating round top dots in the printing plate and a second exposure characteristic for creating flat top dots in the printing plate.

43. The method of any one of items 37-42, wherein adjusting radiation output according to application requirements includes providing a first exposure with a first intensity followed by a second exposure with a second intensity higher than the first intensity.

44. The method of any one of items 37-43, wherein the first exposure combined with the second exposure together provide a total amount of energy required to cure the plate.

What is claimed:

1. A retrofit exposure system for retrofitting a bank light exposure unit configured for use with fluorescent tubes configured to emit actinic radiation, each of the fluorescent tubes having a specified length and a first set of electrical connectors in a first configuration configured to mate with a second set of electrical connectors of the bank light exposure unit having a second configuration and connected to a power supply, the bank light exposure unit including a substrate having a first surface for receiving a photopolymer printing plate, the retrofit exposure system comprising:

a photopolymer printing plate disposed on the first surface of the substrate and defining a target illumination plane on a top side of the photopolymer printing plate;

a plurality of radiation sources spaced from the first surface of the substrate, each radiation source configured to emit actinic radiation directed only toward the target illumination plane, the actinic radiation operative for curing the photopolymer printing plate printing plate each radiation source comprising:

a base having a width and a length along an axis, wherein the length is greater than the width, the base comprising a front portion facing the target illumination plane and an underside portion facing away from the target illumination plane, the front portion comprising a singular rectangular planar mounting surface disposed parallel to the target illumination plane and having a length and a width facing the target illumination plane, the underside portion comprising a metal heat sink;

one or more circuit boards mounted on the mounting surface of the base, the one or more circuit boards collectively comprising a plurality of light emitting diodes (LEDs) each having an ultraviolet center emission wavelength, the plurality of LEDs distributed over the length of the base in an array, the array defining a plurality of LEDs across the length of the LED mounting surface and a plurality of LEDs across the width of the LED mounting surface, all facing the target illumination plane, the plurality of LEDs across the width of the LED mounting surface configured to provide the actinic radiation at an emission angle greater than an emission angle of a single LED in a first plane perpendicular to the axis of the base, greater than an emission angle of a single LED in a second plane containing the axis of the base or parallel to the axis of the base and perpendicular to the target illumination plane, or a combination thereof;

one or more first controllers disposed in the radiation source for regulating power delivered to the plurality of LEDs, each first controller configured to maintain a desired current through the plurality of LEDs;

a plurality of radiation source electrical connectors configured to interface with the second set of electrical connectors; and a cover transparent or translucent to the actinic radiation and mounted on the base, the cover together with the base defining an enclosure for the plurality of LEDs.

2. The exposure system of claim 1, wherein the base comprises a planar cover mounting area for receiving a corresponding surface of the cover, wherein the planar cover mounting area is parallel to the target illumination plane.

3. The exposure system of claim 1, wherein the base and the cover have an interface comprising one or more positive or negative features of the cover configured to mate with one or more mating features in the base.

4. The exposure system of claim 3, wherein the base has a groove configured to receive a radially-inward extending lip of the cover.

5. The exposure system of claim 4, wherein the cover has a semi-cylindrical shape.

6. The exposure system of claim 5, wherein the plurality of LEDs are distributed over the length of the base in a regular rectangular array.

7. The exposure system of claim 1, further comprising one or more clamps configured to hold the cover and the base in a compressive relationship.

8. The exposure system of claim 1, wherein cover comprises one or more prismatic and/or refractive structures.

9. The exposure system of claim 8, wherein the cover comprises one or more cylindrical Fresnel lenses.

10. The exposure system of claim 1, wherein the metal heat sink comprises an underside portion connected to an underside of the rectangular planar mounting surface, wherein the rectangular planar mounting surface has a width greater than a width of the underside portion.

11. The exposure system of claim 10, wherein the array is five LEDs wide.

12. The exposure system of claim 10, wherein the radiation source is configured to replace a fluorescent bulb comprising a tube having a diameter, and the width of the rectangular planar mounting surface is greater than the diameter of the tube.

13. The exposure system of claim 1, wherein the metal heat sink defines a plurality of fins spaced apart from one another with radial edges that define a semi-cylindrical geometry having a semi-circular cross-section.

14. The exposure system of claim 1, wherein the exposure system comprises a housing and the plurality of radiation sources in an installed configuration in the housing have a predetermined spacing between axes of adjacent sources that defines a gap between adjacent edges of adjacent radiation sources, wherein the gap between the radiation sources is less than a corresponding gap between the fluorescent tubes replaced by the radiation sources within the housing.

15. The exposure system of claim 1, wherein the substrate is transparent or translucent to the actinic radiation, and wherein a second set of the radiation sources is spaced below a second surface of the substrate opposite the first surface and facing a bottom side of the printing plate opposite the top side of the printing plate.

16. The exposure system of claim 1, further comprising a second controller configured to transmit control signals to each first controller, the second controller configured to send control signals operative to adjust the plurality of radiation sources to a common level of intensity within a predetermined tolerance.

17. The exposure system of claim 16, wherein the second controller comprises a remote control transmitter for sending wireless signals to one or more wireless remote control receivers connected to the one or more first controllers, the remote control transmitter having one or more inputs for receiving information to be transmitted by the remote control transmitter.

18. The exposure system of claim 17, wherein the one or more inputs comprises a control panel for setting a desired illumination intensity for the radiation sources.

19. The exposure system of claim 17, further comprising one or more photodetectors for detecting a radiation intensity emitted by one or more of the plurality of radiation sources, each photodetector configured to provide a feedback signal to the one or more inputs of the second controller for controlling the intensity emitted by the one or more of the plurality of radiation sources.

20. The exposure system of claim 17, further comprising a sensor configured to measure irradiance emitted by each of the plurality of radiation sources, wherein the first and second controllers are collectively configured to control intensity of each of the radiation sources based upon the measured irradiance.

21. The exposure system of claim 20, wherein the first and second controllers are configured to control the intensity of a first one of the plurality of radiation sources to compensate for a difference in performance characteristics of the first radiation source relative to performance characteristics of a second one of the plurality of radiation sources.

22. The exposure system of claim 20, wherein the first and second controllers are configured to control the intensity of a first one of the plurality or radiation sources to compensate for a change in performance characteristics of the first radiation source over time.

23. The exposure system of claim 1, wherein all of the plurality of LEDs in each radiation source are operable to emit a common center emission wavelength.

24. The exposure system of claim 1, wherein the metal heat sink comprises aluminum.

25. The exposure system of claim 1, wherein the metal heat sink defines a heat transfer surface area having first portions disposed a first radial distance from a defined longitudinal axis and second portions disposed a second radial distance from the defined longitudinal axis.

26. The exposure system of claim 25, wherein the first portions and second portions of the metal heat sink increase a total heat transfer area of the heat transfer surface of the metal heat sink.

27. The exposure system of claim 26, wherein the metal heat sink comprises a plurality of longitudinally-extending fins emanating from a surface of the base and extending along respective radii which emanate from a common center point above the base.

28. The exposure system of claim 1, wherein each of the tubular radiation sources has at least one non-luminescent longitudinal region adjacent at least one end.

29. The exposure system of claim 28, wherein at least one of the one or more first controllers is disposed within the enclosure in the non-luminescent longitudinal region.

30. The exposure system of claim 1, wherein radiation source electrical connectors comprise two sets of radiation source electrical connectors, one set disposed at each end of the radiation source and spaced apart from one another by the specified length, each set having the first configuration and configured to mate with the second set of electrical connectors having the second configuration.

31. The exposure system of claim 30, wherein the first configuration of the first set of electrical connectors comprises a pair of pins having a predetermined geometry and spacing from one another.

32. The exposure system of claim 1, wherein each of the one or more first controllers is configured to compensate for different output intensities emitted by the LEDs per unit current.

33. The exposure system of claim 1, wherein the cover has a semi-cylindrical geometry.

34. An exposure system configured to expose a photopolymer printing plate to actinic radiation operative for curing the photopolymer printing plate, the photopolymer printing plate having a top side and a bottom side opposite the top side, the exposure system comprising:
- a substrate transparent or translucent to the actinic radiation, having a first surface for receiving the photopolymer printing plate and a second surface opposite the first surface;
- a photopolymer printing plate disposed on the first surface of the substrate;
- a plurality of radiation sources, including at least a first set of radiation sources spaced from one of the first surface or second surface of the substrate and facing the photopolymer printing plate disposed on the substrate;
- each of the plurality of radiation sources configured to emit actinic radiation directed only toward the photopolymer printing plate disposed on the substrate, each radiation source comprising:
  - a base having a width and a length along an axis, wherein the length is greater than the width, the base comprising a front portion facing the substrate and an underside portion facing away from the substrate, the front portion comprising a singular rectangular planar mounting surface disposed parallel to the substrate and having a length and a width facing the substrate, the underside portion comprising a metal heat sink;
  - one or more circuit boards mounted on the mounting surface of the base, the one or more circuit boards collectively comprising a plurality of light emitting diodes (LEDs) each having an ultraviolet center emission wavelength, the plurality of LEDs distributed over the length of the base in an array, the array defining a plurality of LEDs across the length of the LED mounting surface and a plurality of LEDs across the width of the LED mounting surface, all facing the substrate, the plurality of LEDs across the width of the LED mounting surface configured to provide the actinic radiation at an emission angle greater than an emission angle of a single LED in a first plane perpendicular to the axis of the base, greater than an emission angle of a single LED in a second plane containing the axis of the base or parallel to the axis of the base and perpendicular to the substrate, or a combination thereof;
  - one or more first controllers disposed in the radiation source for regulating power delivered to the plurality of LEDs, each first controller configured to maintain a desired current through the plurality of LEDs; and
  - a cover transparent or translucent to the actinic radiation and mounted on the base, the cover together with the base defining an enclosure for the plurality of LEDs.

35. The exposure system of claim 34, wherein the first set of radiation sources is spaced above the first surface of the substrate and faces a top side of the photopolymer printing plate disposed on the substrate, and the plurality of radiation sources further comprises a second set of radiation sources spaced below the second surface of the substrate and facing the bottom side of the photopolymer printing plate disposed on the substrate.

36. The exposure system of claim 34, further comprising an exposure system controller programmed to cause the plurality of radiation sources to perform a front side exposure operation on the top side of the photopolymer printing plate, a back side exposure operation on the bottom side of the photopolymer printing plate, or a combination thereof.

37. The exposure system of claim 36, wherein the photopolymer printing plate is a flexographic photopolymer printing plate.

* * * * *

UNITED STATES PATENT AND TRADEMARK OFFICE
CERTIFICATE OF CORRECTION

PATENT NO. : 12,304,190 B2
APPLICATION NO. : 16/972312
DATED : May 20, 2025
INVENTOR(S) : Klaus Walter Arlt Page 1 of 1

It is certified that error appears in the above-identified patent and that said Letters Patent is hereby corrected as shown below:

In the Claims

Column 16, Line 34, Claim 1: delete "photopolymer printing plate printing plate" and insert -- photopolymer printing plate, --

Column 18, Line 33, Claim 22: delete "or" and insert -- of --

Signed and Sealed this
Twenty-ninth Day of July, 2025

Coke Morgan Stewart
*Acting Director of the United States Patent and Trademark Office*